United States Patent
Visser

(10) Patent No.: US 9,562,659 B2
(45) Date of Patent: *Feb. 7, 2017

(54) SOLAR-POWERED LIGHTING ARRANGEMENT

(71) Applicant: Koninklijke Philips N.V., Eindhoven (NL)

(72) Inventor: Peter Visser, Geldrop (NL)

(73) Assignee: PHILIPS LIGHTING HOLDING B.V., Eindhoven (NL)

(*) Notice: Subject to any disclaimer, the term of this patent is extended or adjusted under 35 U.S.C. 154(b) by 244 days.

This patent is subject to a terminal disclaimer.

(21) Appl. No.: 14/105,631

(22) Filed: Dec. 13, 2013

(65) Prior Publication Data

US 2014/0104821 A1   Apr. 17, 2014

Related U.S. Application Data

(63) Continuation of application No. 13/380,573, filed as application No. PCT/IB2010/052828 on Jun. 22, 2010, now Pat. No. 8,632,204.

(30) Foreign Application Priority Data

Jun. 25, 2009 (EP) .................................... 09163752

(51) Int. Cl.
  *F21L 4/00*  (2006.01)
  *F21S 9/03*  (2006.01)
  (Continued)

(52) U.S. Cl.
  CPC ............... *F21S 9/037* (2013.01); *F21S 8/08* (2013.01); *F21S 9/035* (2013.01); *F21V 29/70* (2015.01);
  (Continued)

(58) Field of Classification Search
  USPC ............... 362/152, 153, 157, 183, 184, 187, 190,362/253, 294, 373
  See application file for complete search history.

(56) References Cited

U.S. PATENT DOCUMENTS 8,632,204 B2 *   1/2014   Visser ........................... 362/157
2007/0247842 A1  10/2007  Zampini et al.
(Continued)

FOREIGN PATENT DOCUMENTS

DE      4433476 A1    3/1995
DE    20004250 U1   10/2000
(Continued)

OTHER PUBLICATIONS

Mitchell et al., "Development of a low-cost roof-mounted solar system using flat-plane reflectors", 2005, pp. 1-5, Brisbane, Australia.
(Continued)

*Primary Examiner* — Andrew Coughlin
*Assistant Examiner* — Meghan Ulanday

(57) ABSTRACT

A solar powered lighting arrangement (1), comprising a solar cell (2); a light source (8) adapted to be at least partly powered by electrical power derived from the solar cell (2); and a structural member (3) having a first side (4) provided with a first reflective (5) arranged to direct sunlight (6) towards the solar cell (2) and a second side (7) onto which the light source (8) is thermally coupled for dissipating heat generated by the light source (8) when emitting light (9). With the provision of a solar powered lighting arrangement in accordance with the present invention, the structural member may consequently function not only as a reflecting surface directing sunlight towards the solar cell, but additionally as a heat sink for the light source.

9 Claims, 2 Drawing Sheets

(51) Int. Cl.
  *F21S 8/08* (2006.01)
  *H01L 31/054* (2014.01)
  *F21V 29/70* (2015.01)
  *F21V 29/00* (2015.01)
  *F21V 29/505* (2015.01)
  *F21Y 101/00* (2016.01)

(52) U.S. Cl.
  CPC .......... *H01L 31/0547* (2014.12); *F21V 29/004* (2013.01); *F21V 29/505* (2015.01); *F21Y 2101/00* (2013.01); *Y02E 10/52* (2013.01)

(56) References Cited

U.S. PATENT DOCUMENTS

| | | |
|---|---|---|
| 2008/0029035 A1 | 2/2008 | Gou |
| 2008/0232094 A1 | 9/2008 | Ramsdell |
| 2010/0236622 A1 | 9/2010 | Yao |

FOREIGN PATENT DOCUMENTS

| | | |
|---|---|---|
| DE | 202005004070 U1 | 12/2005 |
| DE | 102007041842 A1 | 5/2009 |
| GB | 2408395 A | 5/2005 |
| JP | 30864730 U | 3/2002 |
| JP | 2004281327 A | 10/2004 |
| JP | 2007150020 A | 6/2007 |
| WO | 2009016563 A1 | 2/2009 |

OTHER PUBLICATIONS http://www.solar-trackers.com/solar-concentrators.asp, "Bifacial solar panels and solar systems", 2011, pp. 1-3.

Notice of Preliminary Rejection from the Korean Intellectual Property Office dated Nov. 14, 2016, and an English translation thereof.

* cited by examiner

SOLAR-POWERED LIGHTING ARRANGEMENT

FIELD OF THE INVENTION

The present invention relates to a solar powered lighting arrangement comprising a solar cell and a light source adapted to be at least partly powered by electrical power derived from the solar cell.

DESCRIPTION OF THE RELATED ART

Bringing artificial light to rural areas may be an approach for development of communities as well as countries. Normal lighting solutions may however not be feasible in many of these rural areas as they often are off-grid, i.e. not covered by power transmission networks. In such situations, one known manner to bring light may be to install solar powered lighting utilizing photovoltaic cells (solar cells) for the purpose of electrical power production. Electrical power may be stored in rechargeable batteries for subsequent use; for instance to power one or several luminaries comprising light sources, which may bring tight to the rural area during dark hours.

In order to reduce expenses related to electrical power production from solar cells, it may be advantageous to utilize reflecting mirrors such as concentrators. Concentrators may be adapted to focus a large area of sunlight into a smaller beam directed towards the solar cells. In this manner, the solar cells may take advantage of an increased amount of sunlight, whereby an increased amount of electricity can be produced. To reach a certain level of electrical power production, fewer cells may hence be needed for a solar panel solution comprising concentrators than for a solution lacking the same. Such an approach is for instance described in DE 44 33 476, disclosing a method of enhancing the performance level of photovoltaic systems in a cost efficient manner. In DE 44 33 476, low outlay on equipment is achieved in that sunlight is concentrated onto the photovoltaic system by means of a reflective system having reflecting faces, which faces consist of colored and therefore wavelength-selective mirrors.

Although DE 44 33 476 describes a manner in which to save cost by introducing wavelength-selective mirrors such that fewer photovoltaic cells may be required, there is still a need to lessen expenses with regards to additional components utilized in known solutions for provision of solar powered lighting. Hence there is a need for an arrangement in which the above-related drawbacks are at least partly eliminated.

SUMMARY OF THE INVENTION

According to the invention, the above is at least partly met by a solar powered lighting arrangement, comprising a solar cell; a light source adapted to be at least partly powered by electrical power derived from the solar cell; and a structural member having a first side provided with a first reflective surface arranged to direct sunlight towards the solar cell and a second side onto which the light source is thermally coupled for dissipating heat generated by the light source when emitting light.

With a solar powered lighting arrangement in accordance with the present invention, the structural member may consequently function not only as a reflector for directing sunlight towards the solar cell, but additionally as a heat sink for the light source. The first reflective surface of the first side is adapted to focus a large area of sunlight into a smaller beam directed towards the solar cell, while the second side of the structural member is acting as a cooling device adapted for transfer of thermal energy (heat) from the light source, thereby lowering the temperature of the light source. A separate heat sink for dissipation of heat generated by the light source when emitting light is hence no longer necessary, as the light source to this end is thermally coupled to the structural member. Neither is a separate luminaire needed, as the light source may be integrated with the structural member which may be capable of directing light emitted by the light source. Fewer components are thus required with the introduced solar powered lighting arrangement as compared to known solutions, thereby providing a cost effective approach.

The solar powered lighting arrangement may be utilized for any suitable implementation, such as for instance for providing street lighting in a rural area or for indoor lighting for people living in the e.g. slum. In the former case, one or several light sources may be coupled to the second side of the structural member and arranged to direct light emitted from the light source essentially towards the ground, whereby efficient solar powered street lighting may be provided. In the latter case, the solar powered lighting arrangement may be part of a e.g. metal corrugated roof of a e.g. simple shed, with the solar cell and first side of the structural member facing the sun and the second side of the structural member facing the inside of the shed. Thereby, a simple and effective solution is provided facilitating cheaper solar powered indoor lighting.

The structural member may be of any shape and of any combination of materials appropriate for dissipating heat in conjunction with directing sunlight towards the solar cell. A solid single material structural member is within the scope of the invention as well as a sandwiched structural member comprising a plurality of layers. Furthermore, desired effects of e.g. the first reflective surface or the second side may even be achieved by coating the structural member. The first reflective surface of the first side may preferably be shaped to direct sunlight towards the cell in an optimal manner, and may hence for instance be concave-shaped. Additionally, the first reflective surface may comprise any material providing a mirroring effect on incoming sunlight, such as for instance metal, stainless steel, aluminum alloys, silver coated polymers or silver coated hardened glass or a combination thereof. Furthermore, the second side may (preferably be shaped for preferably rapid transfer of thermal energy (heat) from the light source, and may hence be of a size and/or thickness sufficient for the implementation at hand. Additionally, the second side may comprise any material providing heat sink characteristics, such as for instance metal.

According to one embodiment, the structural member may be a metal plate. Thereby, the structural member is of an optimal shape and material for directing sunlight towards the solar cell in combination with providing heat sink characteristics for dissipating heat generated by the light source when emitting light. Such a metal plate may for instance be utilized for a solar powered street lighting arrangement, with one or several light sources thermally coupled to a convex second side of the structural member and with a concave reflective surface of the first side to a great extent covering the first side.

In order to assist in spreading light emitted by the light source in an efficient manner, the second side of the structural member may be provided with a second reflective surface arranged to direct light emitted by the light source. Thereby, the second side may not only enable heat dissipation, but may additionally be adapted to reflect light emitted by the light source in a preferred manner. The second reflective surface may for instance be arranged to assist in directing light emitted by the light source in a preferred direction, or arranged to spread the light.

The light source comprised in the introduced solar powered lighting arrangement may be of any type applicable for the implementation at hand, and may according to one embodiment comprise at least one light emitting diode (LED). An LED represents a choice of light source enabling for a long term of life as well as robustness. A heat sink is particularly necessary when utilizing an LED in comparison to e.g. a traditional light bulb for maintaining the LED's potential long term of life, why the structural member to which the LED is thermally coupled for dissipation of heat is especially beneficial in combination with one or several LEDs. It would however be possible, and within the scope of the present invention, to use different types of tight sources, such as organic light emitting diodes (OLEDs), polymeric LEDs (PLEDs), inorganic LEDs, lasers, or a combination thereof, as well as a wide-band (direct of phosphor converted) LED and wide-band (phosphor converted) white LEDs. Furthermore, combinations with other light sources like TL, CFL are also possible.

In order to enable for an increased amount of electrical power to be generated, the solar cell may be comprised in an interconnected assembly of a plurality of solar cells. Thereby, the solar cell may be part of a solar panel efficiently providing a package solution if more than one solar cell is available for implementation. For further reasons such as cost and practicality, a number of cells may hence be connected electrically and packaged in a solar panel. By mechanically fastening the solar cells together, for instance with a covering hood of e.g. glass and a frame, the solar cells may furthermore be protected from the surrounding environment and subsequently from e.g. dust, rain, hail, and dust storms.

The greatest need for artificial lighting may occur during the dark hours, why the light source preferably is enabled to emit light also after the sun sets. Subsequently, the solar powered lighting arrangement may further comprise an intermediate storage unit for storing electrical power from the solar cell. With such an intermediate storage unit, for instance a rechargeable battery, the solar powered lighting arrangement may store electrical power generated from the solar cell during the e.g. day, for subsequent use for instance as the night falls when the need for artificial light may be greater.

In order to avoid wastefulness of electrical power, the solar powered lighting arrangement may further comprise a presence detection sensor adapted to activate the light source. With such a presence detection sensor, the light source may be switched on if someone or something comes within the coverage area of the sensor, meanwhile being switched off if for instance no movement or body heat is detected within the area. Thereby, energy waste may be avoided in that the light source is activated only when considered necessary, and electrical power for instance stored within the intermediate storage unit may be allowed to last longer.

In an effort to maximize the amount of sun hitting the first reflective surface of the first side of the structural member subsequently directed towards the solar cell, the solar powered lighting arrangement may further be adapted to angle the first reflective surface of the first side such that a focal point of sun tight is kept upon the solar cell as the sun moves across the sky. By implementation of for instance a solar tracker detecting the position of the sun, the first reflective surface may be arranged to be tilted or rearranged such that the sun light may be optimally directed towards the solar cell regardless of the time of the day. Rearrangement of the first reflecting surface may for some embodiments imply that the entire structural member or at least a great part of it is physically affected.

To be able to control the functionality of the solar powered lighting arrangement, such as for instance activation of the Hot source and/or tilting of the first reflective surface discussed in the foregoing, the solar powered lighting arrangement may further comprise a control unit for control of the arrangement. Such a control unit may alternatively or additionally be adapted to for instance control in which direction light emitted from the tight source is directed or reflected, and/or composition of emitted light, e.g. control of color and/or intensity, should more than one e.g. differently (primary) colored light source be available.

In order to be able to provide e.g. a softer light from the light source, the solar powered lighting arrangement may further comprise a diffuser layer for diffusing light emitted from the tight source. By applying such a layer for instance in the vicinity of the light source, light emitted from the light source may be scattered or spread in a manner appropriate for the implementation at hand. The diffuser layer may additionally assist in protecting for instance the second side, or at least the light source, from the surrounding environment.

According to one embodiment, the solar powered lighting arrangement is arranged on a standing pole. Thereby, a means for efficient mounting is provided which may enable for e.g. street lighting in for instance rural areas.

BRIEF DESCRIPTION OF THE DRAWINGS

These and other aspects of the present invention will now be described in more detail, with reference to the appended drawings showing currently preferred embodiments of the invention, in which.

DETAILED DESCRIPTION OF EMBODIMENTS

Figure 1:
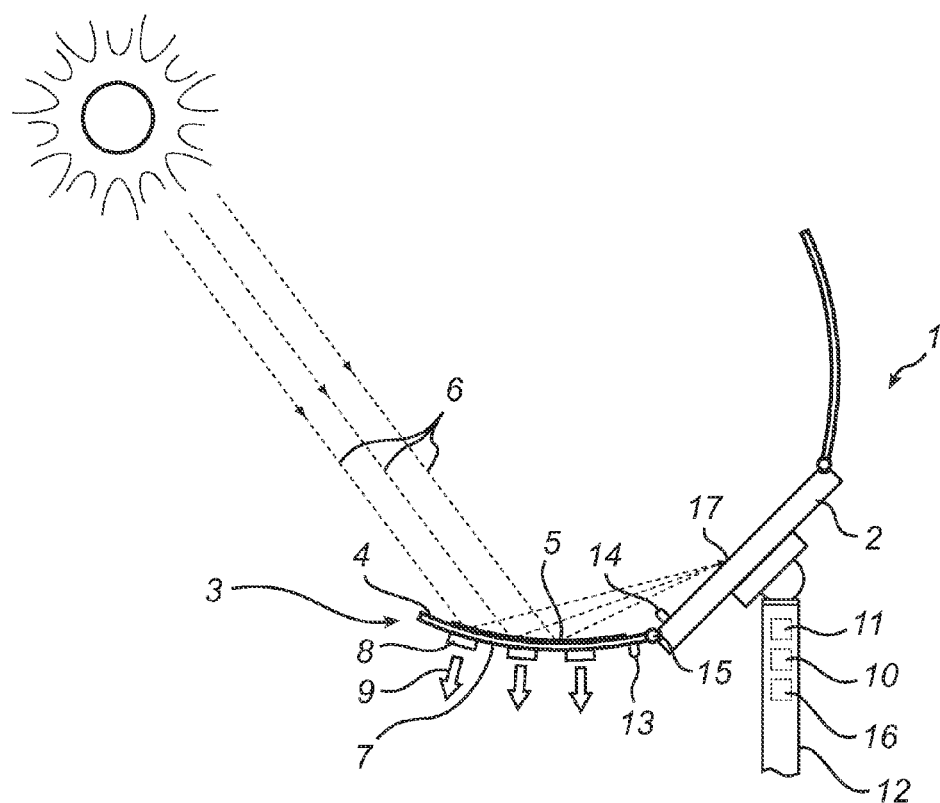
FIG. 1 illustrates an exemplifying solar powered lighting arrangement in accordance with a first embodiment of the present invention.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled addressee. Like reference characters refer to like elements throughout.

FIG. 1 illustrates an exemplifying solar powered lighting arrangement 1 in accordance with a first embodiment of the present invention. For simplicity, the solar powered lighting arrangement 1 of FIG. 1 comprises a single solar cell 2. Note however, that more than one solar cell may be present with the solar powered lighting arrangement 1 such as an interconnected assembly of a plurality of solar cells. The illustrated single solar cell 2 may hence likewise be one or several solar panels which further may be provided with a covering hood for protection from the surrounding environment. It is to be understood that the solar cell 2 may be represented by any applicable solar cell or panel known in the art, and that the solar cell 2 may be adapted to generate electrical power in a known manner. In order to envisage the ability of the solar powered arrangement 1 to derive electrical power from the solar cell 2, a means for deriving electrical power 10 is illustrated. The means for deriving electrical power 10 may comprise any known solution in the art, and may for instance comprise necessary electrical circuitry and a charge controller. Furthermore, for illustration of ability to store electrical power from the solar cell 2, an intermediate storage unit 11, e.g. a rechargeable battery, is depicted.

The solar powered lighting arrangement 1 of the present invention may comprise one or several structural members 3 preferably arranged in the vicinity of the solar cell 2. The disposition of the structural member(s) 3 may be arbitrary and arranged with the implementation at hand in mind. The structural member 3 comprises a first side 4 facing the solar cell 2, which first side 4 may be provided with a first reflective surface 5 arranged to direct sunlight 6 towards the solar cell 2. The first reflective surface 5 may comprise any material providing a mirroring effect on incoming sunlight, such as for instance metal, stainless steel, aluminum alloys, silver coated polymers or silver coated hardened glass or a combination thereof. In FIG. 1, the structural member 3 is essentially a curved plate and may hence direct sunlight towards the solar cell 2 in an efficient manner. The shape of the structural member 3 is however by no means restricted to that of the illustrated example; on the contrary, any shape applicable for the application at hand is within the scope.

The structural member 3 furthermore comprises a second side 7. In FIG. 1, the second side 7 is essentially opposed to the first side 4. Note, however, that the second side 7 likewise may be disposed in any arbitrary manner feasible; an alternative exemplifying disposition will be described later on in conjunction with FIG. 2.

The solar powered lighting arrangement 1 may comprise one or several light sources 8 adapted to be at least partly powered by electrical power derived from the solar cell 2. With the provision of light sources 8, artificial light may be provided e.g. after the sun sets. It should be noted that the light source 8 may comprise or be accompanied by any number of optical and/or non-optical components to provide a variety of optical effects (not shown). These components may include, but are not limited to, one or more reflective surfaces, lenses, diffusers, and the like, used in different combinations to provide a desired effect.

The light source(s) 8 may be arranged onto the second side 7 and subsequently thermally coupled to the structural member 3. The structural member 3 may hence act as a heat sink for dissipation of heat generated by the light source 8 when emitting light 9. Note that a separate heat sink for dissipation of heat generated by the light source 8 hence is not necessary, as the light source 8 to this end is thermally coupled to the structural member 3. Neither is a separate luminaire for containing the light source 8 required, as the light source 8, as shown, may be integrated with the structural member 3. In the illustrated example of FIG. 1, the light source 8 is an LED.

In order to in an efficient manner function as a heat sink, the second side 7 is preferably of a material having characteristics to that end. In the illustrated example, the entire structural member 3 is of metal, i.e. of a solid single material. The structural member 3 may alternatively comprise any combination of materials appropriate for dissipating heat in conjunction with directing sunlight towards the solar cell 2. A sandwiched structural member comprising a plurality of layers is hence likewise within the scope. Furthermore, desired effects of e.g. the first reflective surface 5 or the second side 7 may even be achieved by coating the structural member 3.

Although not a necessity for the present invention, in the first embodiment, the solar powered lighting arrangement 1 is provided in conjunction with a standing pole 12. Thereby, the solar powered lighting arrangement 1 may provide e.g. street lighting in dark places such as off-grid rural areas. For efficient street lighting, the light source 8 is here arranged to direct light 9 emitted from the light source 8 essentially towards the ground. It should however be noted, that the light source 8 for other implementations may be arranged to direct light 9 in any other direction; different light sources 8 may even be arranged to direct light 9 in different directions.

The solar powered lighting arrangement 1 may furthermore comprise a presence detection sensor 13 adapted to activate the light source 8. The characteristics of the presence detection sensor 13 may vary, and presence detection sensor 13 known in the art may be implemented. With a presence detection sensor 13, the light source 8 may be switched on if someone or something comes within the coverage area of the sensor 13, and switched off if for instance no movement or body heat is detected within that area. The positioning of the presence detection sensor 13 as well as settings with regards to for instance coverage area, sensitivity and timing parameters may be arbitrary, and may be adjusted with the present implementation in mind. According to alternative embodiment, switching the light source 8 on and off may be achieved by for instance a switch or remote control rather than by means of a presence detection sensor 13.

In order to maximize the amount of sun 6 hitting the first reflective surface 5 subsequently directed towards the solar cell 2, the solar powered lighting arrangement 1 may further be adapted to angle the first reflective surface 5 such that a focal point 17 of sun light is kept upon the solar cell 2 as the sun moves across the sky. According to the first embodiment, a solar tracker 14, which may be known in the art, is provided for detection of the position of the sun. The disposition of the solar tracker 14 in the illustration is exemplifying, and any arbitrary applicable positioning is likewise within the scope. The first reflective surface 5 may be arranged to be tilted or rearranged such that the sun light 6 may be optimally directed towards the solar cell 2 regardless of the time of the day. Such tilting or rearrangement may for instance be enabled with hinges 15 by which the structural member 3 may be movably attached to e.g. the solar cell 2 and for instance a motor connected thereto (not shown). Other applicable mounting alternatives enabling for tilting or rearrangement of the first reflective surface 5, and perhaps even the first side 4 or the entire structural member 3, are naturally also feasible.

To be able to control the functionality of the solar powered lighting arrangement 1, such as for instance activation of the light source 8 and/or tilting or rearrangement of the first reflective surface 5, a control unit 16 for control of the solar powered lighting arrangement 1 may be provided. Such a control unit 16 may furthermore be adapted to control in which direction light 9 emitted from the light source(s) 8 may be directed or reflected, and/or composition of emitted light, e.g. control of color and/or intensity. In the illustrated example, the control unit 16 is along with the means for deriving electrical power 10 and the intermediate storage unit 11 depicted to be conveniently placed in conjunction with the pole 12. Note however that the disposition of these devices 16, 10, 11 is exemplifying, and that any arbitrary applicable positioning, for instance in conjunction with the solar cell 2 or structural member 3, likewise is within the scope.

In use, the solar powered lighting arrangement 1 may function in accordance with the following exemplifying procedure. During the day, the sun may shine on the solar cell 2 and additionally or alternatively on the first reflective surface 5 for subsequent reflection of sunlight 6 towards the solar cell 2. Electrical power may thereby be generated by the means for deriving electrical power 10 and stored in the intermediate storage unit 11. As the day passes, the solar tracker 14 may detect the position of the sun as it moves across the sky, whereby the control unit 16 may rearrange or tilt the first reflecting surface 5—here the entire structural member 3—accordingly. As the night falls, or even during daylight should that be preferred, the light source 8 may be driven by electrical power derived from the solar cell 2, and activated/deactivated for instance when someone comes within, or leaves, the coverage area of the presence detector 13.

Figure 2:
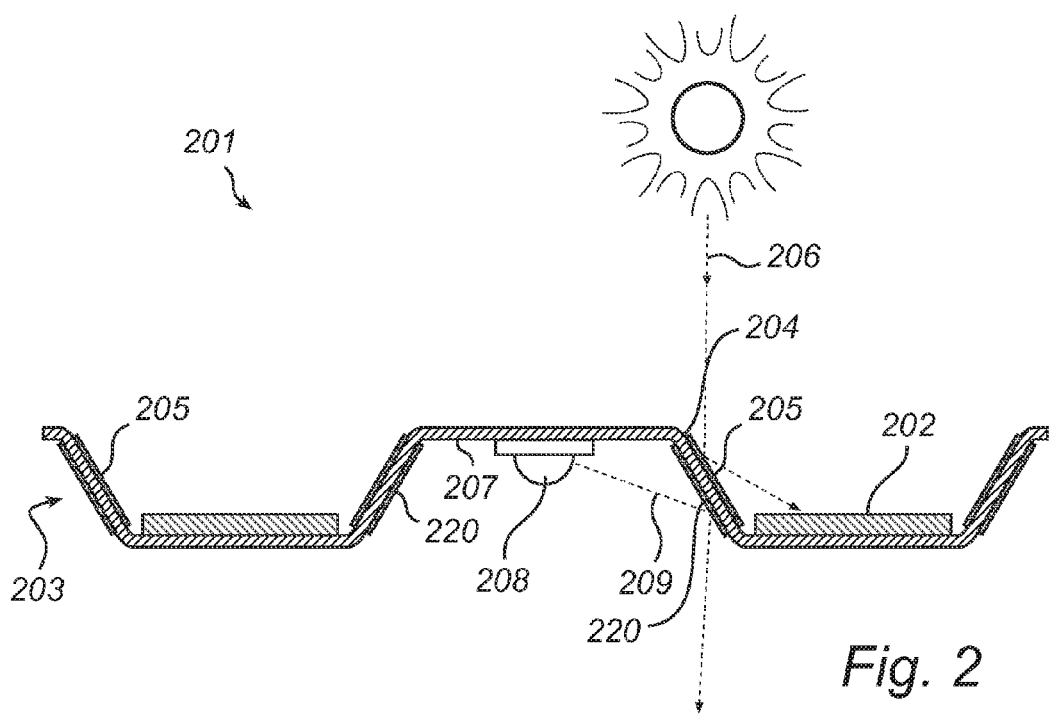
FIG. 2 presents an exemplifying solar powered lighting arrangement in accordance with a second embodiment of the present invention.

FIG. 2 presents an exemplifying solar powered lighting arrangement 201 in accordance with a second embodiment of the present invention. The illustrated solar powered lighting arrangement 201 resembles that 1 described in conjunction with FIG. 1, why only distinctive differences are discussed in the following.

The solar powered lighting arrangement 201 of FIG. 2 is in contrast to that of FIG. 1 shaped to be convenient for instance for indoor lighting. The structural member 203 is here a large structure making part of a corrugated roof of a simple shed, with the first side 204 of the structural member 203 facing the sun and the second side 207 facing the inside of the shed. Note that the structure 203 neither necessarily is corrugated, nor necessarily is part of a roof; other implementations may likewise be applicable.

The solar powered lighting arrangement 201 here comprises a plurality of solar cells or panels 202 arranged on top of the structural member 203, i.e. on the first side 204. The first side 204 of FIG. 2 may furthermore comprise a plurality of first reflecting surfaces 205 disposed along the structural member 203, preferably arranged to in an optimal manner direct sunlight 206 towards the respective solar cell 202.

According to the second embodiment, a second reflective surface 220 may be arranged in the vicinity of the light source 208. The second reflective surface 220 is here provided along the second side 207 of the structural member 203, preferably arranged to in an optimal manner direct light 209 emitted by the light source 8 in a desired direction, for instance towards the floor, or to spread the light 209. The second reflective surface 220 may have any shape applicable for the implementation in mind, and may comprise any material, e.g. metal, providing desired reflecting characteristics. The second reflecting surface 220 may be presented by a separate layer or coating, or may even be represented by the material of the second side 207 itself. The second side 207 may comprise and/or be provided with a plurality of such second reflective surfaces 220 disposed along the structural member 203, for instance should there be more than one light source 208 available.

The power lighting arrangement 201 of FIG. 2 resembles that 1 of FIG. 1 in that the tight source 208 is arranged onto the second side 207 and subsequently thermally coupled to the structural member 203. The structural member 203 may hence as well in this second embodiment act as a heat sink for dissipation of heat generated by the light source 208 when emitting light 209, constitute a luminaire for the light sources 208, as well as function as a reflector 205 for directing sunlight 206 towards the solar cell 202.

Figure 3:
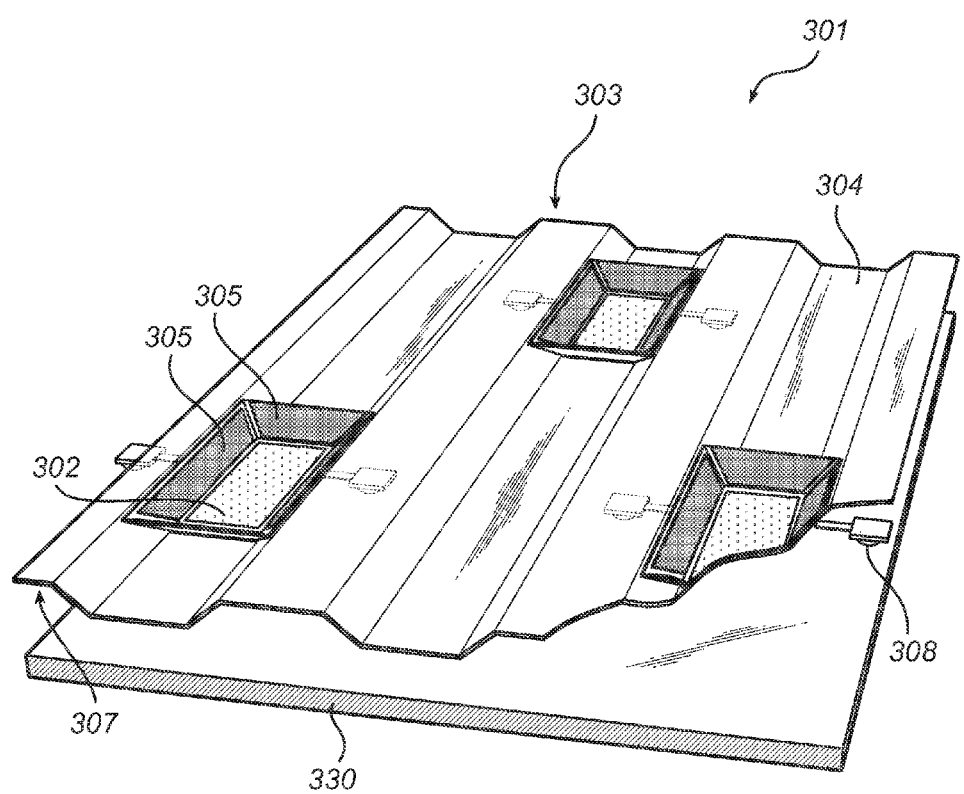
FIG. 3 illustrates in a three-dimensional view an exemplifying solar powered lighting arrangement in accordance with a third embodiment of the present invention.

FIG. 3 illustrates in a three-dimensional view an exemplifying solar powered lighting arrangement 301 in accordance with a third embodiment of the present invention. The illustrated solar powered lighting arrangement 301 resembles those described in conjunction with FIGS. 1 and 2, why only distinctive differences are discussed in the following.

The structural member 303 of FIG. 3 is here a large structure making part of a corrugated metal roof, and may hence similar to the second embodiment of FIG. 2 be convenient for instance for indoor lighting. The solar powered lighting arrangement 301 of FIG. 3 comprises a plurality of solar cells or panels 302 arranged across the first side 304 of the structural member 303 and a plurality of light sources 308 arranged across the second side. Each solar cell 302 is here provided with four first reflective surfaces 305 for directing sunlight towards the corresponding solar cell 302, and two light sources 308. Note that the positioning as well as the number of solar cells 302, reflective surfaces 305 and light sources 308 are exemplifying, and that other feasible constellations likewise are within the scope. The solar cells 302 are here disposed in arrays such that a matrix is formed, whereby the solar powered lighting arrangement 301 may present a package solution spread over a larger roof area rather than provided at a single point.

The exemplifying solar powered lighting arrangement 301 of FIG. 3 furthermore comprises a diffuser layer 330 for diffusing light emitted from the light sources 308. The diffuser layer 330 may provide for light emitted from the light sources 308 to be scattered or spread in a manner appropriate for the implementation at hand. The diffuser layer 330 may additionally assist in protecting for instance the second side 307, or at least the light sources 308, from the surrounding environment. In the illustrated example, the diffuser layer 330 is arranged below the light source(s) 308 across the entire structural member 303. Note, however, that such a diffuser layer 330 for instance likewise may cover only one or a few of the light sources 308 and may be positioned differently of have a different shape should that be feasible for the implementation in mind.

As the light sources 308 of the third embodiment described in the foregoing 110 similarly to the exemplifying solutions of the first and second embodiments are arranged onto the second side 307 and subsequently thermally coupled to the structure 303, the structural member 303 may hence as well in this third embodiment act as a heat sink for dissipation of heat generated by the light sources 308, constitute a luminaire for the light sources 308, as well as function as a reflector 305 directing sunlight 306 towards the solar cells 302.

The skilled addressee realizes that the present invention by no means is limited to the preferred embodiments described above. On the contrary, the skilled addressee understands that many modifications and variations are possible and within the scope of the appended claims. Variations to the disclosed embodiments can be understood and effected by the skilled addressee in practicing the claimed invention, from a study of the drawings, the disclosure, and the appended claims. In the claims, the word "comprising" does not exclude other elements or steps, and the indefinite article "a" or "an" does not exclude a plurality.

The invention claimed is:

1. A solar powered lighting arrangement, comprising:
    a solar cell;
    a light source comprising at least one light-emitting diode and adapted to be at least partly powered by electrical power derived from the solar cell;
    a diffusing layer for diffusing lighting emitted from said light source, and
    a structural member having a first side provided with a first reflective surface arranged to direct sunlight towards the solar cell and a second side, opposed to the first side, onto which the light source is arranged and thermally coupled for dissipating heat generated by the light source when emitting light.

2. The solar powered lighting arrangement according to claim 1, wherein the structural member is a metal plate.

3. The solar powered lighting arrangement according to claim 1, wherein the second side is provided with a second reflective surface arranged to direct light emitted by the light source.

4. The solar powered lighting arrangement according to claim 1, wherein said solar cell is comprised in an interconnected assembly of a plurality of solar cells.

5. The solar powered lighting arrangement according to claim 1, further comprising an intermediate storage unit for storing electrical power from the solar cell.

6. The solar powered lighting arrangement according to claim 1, further comprising a presence detection sensor adapted to activate the light source.

7. The solar powered lighting arrangement according to claim 1, wherein said arrangement is adapted to angle said first reflective surface of the first side such that a focal point of sun light is kept upon said solar cell as the sun moves across the sky.

8. The solar powered lighting arrangement according to claim 1, further comprising a control unit for control of the arrangement.

9. The solar powered lighting arrangement according to claim 1, wherein said arrangement is arranged on a standing pole.

* * * * *